United States Patent [19]
Norris

[11] Patent Number: 5,997,234
[45] Date of Patent: *Dec. 7, 1999

[54] SILICON FEED SYSTEM

[75] Inventor: Joseph R. Norris, Pittsburg, Pa.

[73] Assignee: Ebara Solar, Inc., Large, Pa.

[ * ] Notice: This patent issued on a continued prosecution application filed under 37 CFR 1.53(d), and is subject to the twenty year patent term provisions of 35 U.S.C. 154(a)(2).

[21] Appl. No.: 08/841,245

[22] Filed: Apr. 29, 1997

[51] Int. Cl.⁶ .................................................. B65G 65/00
[52] U.S. Cl. ............................................ 414/196; 198/786
[58] Field of Search .................................... 414/150, 158, 414/159, 196, 197, 432; 198/786; 110/293, 110

[56] References Cited

U.S. PATENT DOCUMENTS

| | | | |
|---|---|---|---|
| 2,515,455 | 7/1950 | Liptor | 110/293 X |
| 3,259,225 | 7/1966 | Lehde et al. | 198/786 X |
| 3,297,130 | 1/1967 | Greck | 198/786 X |
| 3,426,881 | 2/1969 | Dwyer | 198/786 X |
| 3,610,391 | 10/1971 | Beck | 414/158 X |
| 3,827,582 | 8/1974 | Lederer | 198/786 X |
| 3,905,472 | 9/1975 | Schuster | 198/786 X |
| 4,040,513 | 8/1977 | Walls | 198/786 X |
| 4,391,560 | 7/1983 | Fardin | 198/786 X |
| 5,178,077 | 1/1993 | Norris et al. | 110/110 X |
| 5,242,667 | 9/1993 | Koziol et al. | 422/249 |
| 5,499,709 | 3/1996 | Easton | 198/786 |

FOREIGN PATENT DOCUMENTS

| | | |
|---|---|---|
| 0 170 856 | 2/1986 | European Pat. Off. . |
| 0 390 502 | 10/1990 | European Pat. Off. . |
| 01122988 | 5/1989 | Japan . |
| 2 085 831 | 5/1982 | United Kingdom . |
| 91/13192 | 9/1991 | WIPO . |

OTHER PUBLICATIONS

Harvey, David S.; Recent Progress in octagon Growth using Edge–Defined Film–Fed Growth; vol. 104, No., Jul. 1, 1990, pp. 88–92, XP000164475.

*Primary Examiner*—David A. Bucci
*Attorney, Agent, or Firm*—Graham & James LLP

[57] ABSTRACT

A silicon pellet feed system for use with a silicon melt furnace used to grow a silicon web. A reservoir for containing feed particles is coupled to the upper end of a feed tube. The lower end of the feed tube is positioned adjacent a pair of rotatable drive rollers driven by a motor through a coupling and a pair of gears. The rollers are mounted at an angle with respect to horizontal and the outlet end of the roller feed path is located above a delivery tube leading to the silicon melt furnace. The elements are surrounded by an enclosure having a vacuum outlet for enabling the enclosure to be evacuated to a working vacuum level and a gas inlet for enabling an inert gas to be back filled into the enclosure. The feed rate is determined by the angle of the drive rollers, the speed of the motor and the shape of the bottom end of the feed tube. The rollers are resilient to provide enhanced surface friction for the particle flow and to prevent trapped feed particles from jamming the motor.

8 Claims, 1 Drawing Sheet

VIEW "A-A"

SILICON FEED SYSTEM

BACKGROUND OF THE INVENTION

This invention relates to an apparatus for growing silicon dendritic web from a melt. More particularly, this invention relates to an improved feed system for supplying silicon feed stock to a melt contained in a furnace to continuously replenish the melt as single crystal silicon dendritic web is withdrawn.

The growth of an n- or p-type silicon dendritic web is typically accomplished in a system that includes a heated susceptor having a crucible containing molten silicon (the melt) within an inert atmosphere furnace. The heating is typically done by an inductive coil or a resistive heater, e.g. a relatively high current passed through graphite plates. The silicon web is formed by the solidification of a liquid film supported by surface tension between two silicon filaments known as dendrites. After formation of the web, these dendrites are removed from the web as it is processed into individual cells. The melt replenishment method is very important for decreasing costs and improving web growth and crystal quality.

In a system for the growth of a dendritic web, silicon particles or pellets may be added at one or both ends of the crucible as the web crystals are grown in order to replenish the melt. The heat absorbed in the regions where melting of the replenishment material takes place creates a significant thermal imbalance in the region from which the web is drawn and disturbs growth. This disturbance can be reduced by the uniform, continuous input of silicon particles at a controlled rate. Long, continuous growth of single crystal dendritic web silicon ribbon requires that the melt be replenished with silicon as the crystal is being pulled. This can be done from a reservoir of silicon particles by a feeding mechanism located above the melt but outside of the furnace chamber. However, silicon shot, pellets and other irregular shapes and sizes that are commercially available cause the feeding mechanism to be erratic in operation. Problems can range from operating without particles dropping into the melt to a catastrophic spill of particles into the melt causing molten silicon to overflow and destroy valuable molybdenum furnace parts.

In addition to being complex and hence costly in terms of material utilization and in the amount of machining and assembly required, the former feeding mechanism occupies a large volume. If a larger quantity of silicon is released such that it overflows the crucible or is misdirected and does not enter the proper opening, it reacts with and destroys expensive molybdenum furnace components. In the other extreme, if the operator of the feeding mechanism is unaware of the lack of particles, the former feeding mechanism can operate empty for an extended period of time and result in the melt level dropping in the crucible and the web thinning and pulling out of the melt. Particles can also become jammed in small holes or tubes and not drop. This leads to gross uncertainty in the rate of silicon delivery to the melt.

In some systems, such as vibratory feeders, particle segregation can occur due to the quantity of material required in the vibratory bowl to initiate feeding. The particles separate after a period of time, with larger particles moving toward the center and smaller particles toward the outside, where an inclined metal track is located. This makes calibration of this type of system difficult, since there is uncertainty as to what particle size will be discharged for any one given excitation level.

It is therefore desired to have a silicon feed apparatus which can deliver semiconductor grade silicon into a controlled atmosphere furnace by a system without metallic components that may contaminate the silicon, and that is capable of holding a vacuum of around 20 millitorr so that the feed mechanism and the furnace can be evacuated and back-filled with an inert and moisture-free atmosphere.

SUMMARY OF THE INVENTION

The above disadvantages of the prior feed systems are overcome by an improved, reliable and much simpler feeding system. The apparatus of this invention has a pellet reservoir located above the feeding mechanism. The pellet reservoir is connected to the feeding mechanism by means of an upper supply tube which allows the pellets to flow by gravity. The shape at the end of the tube conforms to a large degree with the contour of a pair of feed rollers, which are located along the longitudinal axis of the feeding mechanism. The rollers, in close proximity with each other, are supported by a frame and are allowed to rotate on a set of bearings. The rollers are further joined together via a set of spur gears. In operation, rotating the drive roller in the direction of the pellet flow allows the pellets to roll and rotate freely, thus exerting little resistance to the drive motor. By angling the rollers, gravity moves the pellets away from the feed tube and produces a serial string of pellets that move to the end of the roller. By controlling the rotation speed, one can control the rate that the pellets discharge off the roller. The pellets are then guided to the feed chamber in the furnace.

For a fuller understanding of the nature and advantages of the invention, reference should be had to the ensuing detailed description taken in conjunction with the accompanying drawings.

DETAILED DESCRIPTION OF THE PREFERRED EMBODIMENT

Figure 1:
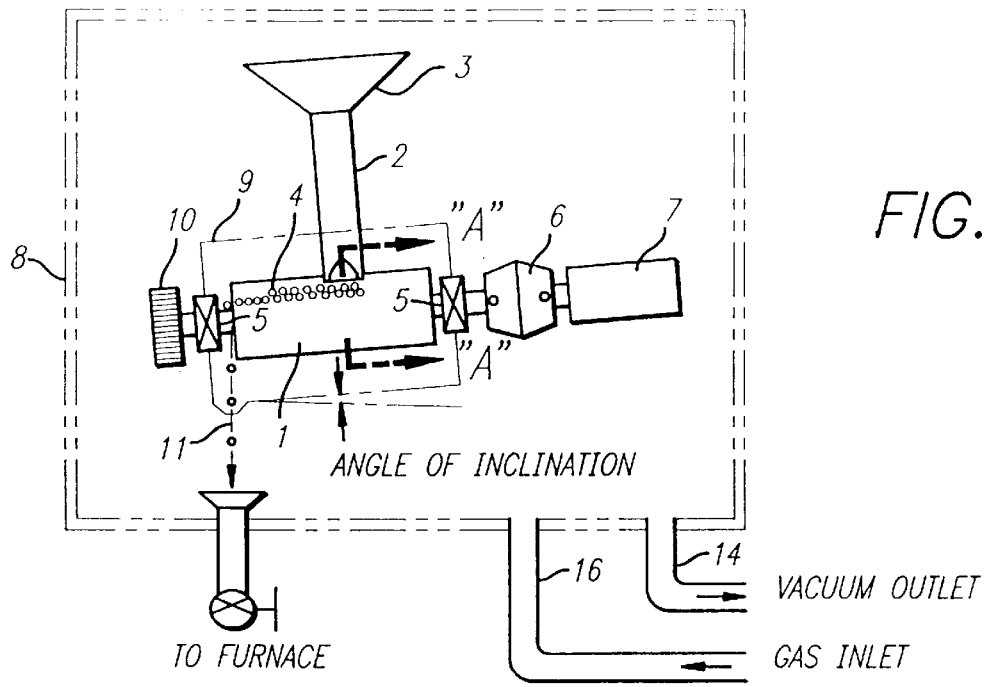
FIG. 1 is a sectional view showing the chamber enclosure and the roller feeder mechanism contained within.
Figure 3:
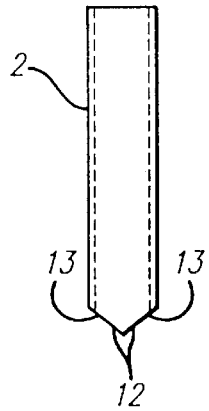
FIG. 3 is a detail front sectional view of the feed tube showing the shape of the end of the tube.
Figure 4:
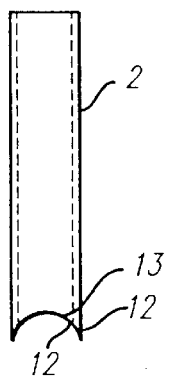
FIG. 4 is a detail side sectional view of the feed tube.

Turning now to the drawings, FIG. 1 is a system incorporating the present invention for feeding various sized and shaped silicon particles to a silicon melt in a crucible within a furnace. An enclosure 8, capable of being hermetically sealed, is large enough to contain the present invention. A reservoir 3 contains various sized and shaped silicon particles 4. These particles are generally screened to lie within a range from about 0.6 micron to about 2 micron in size. A tube 2 connects the supply reservoir 3 to the feed rollers 1. The end shape of the tube 2 determines the amount of particles that are released while the rollers 1 rotate. As best shown in FIGS. 3 and 4, a downwardly extending tail 12 formed on the lower end of the feed tube 2 directs the majority of material flow onto the surface of rollers 1. The tail portion 12 has a pair of flanking arcuate wall sections 13 which are contoured to be conformable with the proximate surface portions of rollers 1. Tube 2 is preferably formed from stainless steel, such as type 303, 304 stainless steel.

Figure 2:
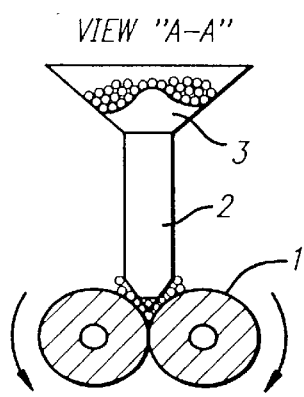
FIG. 2 is a detail sectional view of the funnel relationship to the pair of drive rollers.

The rollers 1 are coupled together via a set of spur gears which have the same pitch diameters as the drive rollers. Referring to FIG. 2, the rollers 1 are of substantially equal diameter and are preferably made from urethane rubber (56 Durometer Shore A, for example) to allow any pellet that gets caught between the lower end of the feed tube 2 and either one of the drive rollers 1 to deform the drive roller 1 and continue past, ejecting on the other side of the feed tube, without causing a jam and stalling the motor 7. The motor 7 is joined to one of the drive rollers 1 via a conventional coupling 6. Rollers 1 are mounted for rotation on shielded bearings 5, which are held in position by means of a frame 9. Motor 7 can be operated at different speeds to vary the feed rate to a desired amount. Pellets leave the lower end of the feed tube 2 at a rate that depends on the angle of inclination of the rollers 1 as well as the speed of rotation. The pellets proceed to the end of the roller 1 and roll off in serial fashion following the particle path 11 into the furnace (not shown). With urethane rollers 1, when rotation stops the pellets will also stop due to the friction of the roller surface.

Frame enclosure 9 is provided with a vacuum outlet port 14 as well as a gas inlet port 16. Vacuum outlet port 14 is coupled to a vacuum source so that the interior of frame enclosure 9 may be evacuated to a working level (preferably about 20 millitorr) after the feed material has been installed in reservoir 3. Gas inlet port 16 is coupled to a source of inert gas for the purpose of providing an inert atmosphere within the interior of frame enclosure 9. The vacuum source and the inert gas source may be the same as those used to evacuate and provide an inert atmosphere to the associated silicon melt furnace.

Experimental tests were conducted to determine the ability of the above described apparatus to maintain a constant feed rate. Table 1 below shows the feed rate as a function of roller speed in revolutions per minute (rpm) at a roller inclination of fifteen degrees to horizontal. The feed rate is not smooth because the supplied feed material is of large discrete quantities; however, the mechanism maintains a feed rate within an envelope about the desired feed rate line.

TABLE 1

| RPM | G./MIN. |
| --- | --- |
| 0.18 | 0.038 |
| 0.281 | 0.0553 |
| 0.382 | 0.072 |
| 0.485 | 0.0925 |
| 0.582 | 0.1208 |
| 0.6 | 0.13 |
| 1 | 0.24 |
| 1.4 | 0.32 |
| 2 | 0.39 |
| 2.3 | 0.46 |

Figure 5:
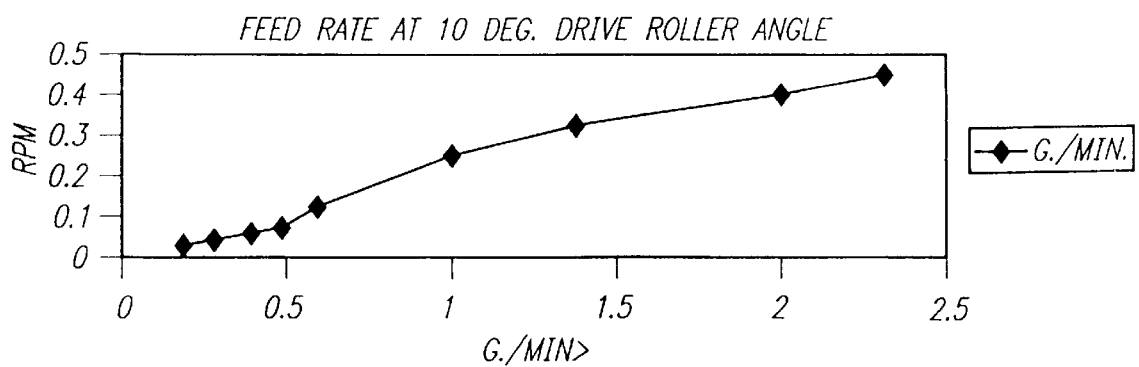
FIG. 5 is a graph showing the relationship between drive roller rotation and feed rate at an angle of the drive rollers of ten degrees to horizontal.

FIG. 5 shows a plot of feed rate versus revolution per minute of the rollers for an inclination of ten degrees to horizontal.

As will now be apparent, silicon feed systems fabricated in accordance with the teachings of the invention are capable of providing silicon feed material at a reliable feed rate. In particular, by adjusting the feed material particle size and with additional feedback control, much greater accuracy in maintaining a constant feed rate can be obtained. In addition, the invention provides a silicon feed apparatus capable of delivering silicon feed material into a controlled atmosphere furnace without the need for metallic components which might contaminate the silicon. In addition, the invention is capable of holding a vacuum required for silicon web growth so that both the feed mechanism and the associated furnace may be evacuated and back filled with an inert and moisture-free atmosphere.

While the above provides a full and complete disclosure of the preferred embodiments of the invention, various modifications, alternate constructions and equivalents will occur to those skilled in the art. Therefore, the above should not be construed as limiting the invention, which is defined by the appended claims.

What is claimed is:

1. An apparatus for supplying feed particles to a silicon melt furnace at a controllable rate, the apparatus comprising:

a reservoir for containing a quantity of feed particles;

a delivery tube having a first end coupled to said reservoir and an open outlet end;

a pair of rotatable drive rollers for providing a particle feed path, said open end of said delivery tube being positioned adjacent said pair of drive rollers;

means for rotating said drive rollers; and an enclosure surrounding said reservoir, said delivery tube, said pair of rotatable drive rollers and said rotating means, said enclosure being capable of being evacuated to a working vacuum level and containing inert gas, said enclosure including a feed particle outlet, whereby operation of said rotating means causes said feed particles originally located in said reservoir to be fed by gravity through the delivery tube, out the outlet end and along the surfaces of said rollers to said feed particle outlet.

2. The apparatus of claim 1 wherein said enclosure further includes a vacuum outlet port and a gas inlet port to facilitate evacuation of the interior of said enclosure to said working vacuum level and filling of the interior of said enclosure with an inert gas.

3. The apparatus of claim 1 wherein said drive rollers are mounted at an angle with respect to a horizontal reference to facilitate the flow of feed particles along the surface thereof.

4. The apparatus of claim 1 wherein said drive rollers are fabricated from a resilient material.

5. The apparatus of claim 1 wherein said rotating means includes a drive motor, and a mutually engaged pair of gears mounted to said pair of drive rollers.

6. The apparatus of claim 5 further including a drive coupling between said motor and one of said pair of drive rollers.

7. The apparatus of claim 6 wherein said gears are mounted on the ends of said pair of drive rollers remote from said motor.

8. The apparatus of claim 1 wherein said feed tube outlet end has a tail portion extending between the surfaces of said pair of rollers.

\* \* \* \* \*

UNITED STATES PATENT AND TRADEMARK OFFICE
CERTIFICATE OF CORRECTION

PATENT NO. : 5,997,234
DATED       : December 7, 1999
INVENTOR(S) : Joseph R. Norris It is certified that error appears in the above-identified patent and that said Letters Patent is hereby corrected as shown below:

Column 2, line 57, change "a range from about 0.6 micron to about 2 micron in size." to -- a range from about 0.6 millimeter to about 2.0 millimeter in size. --

Signed and Sealed this

Twenty-seventh Day of March, 2001

Attest:

NICHOLAS P. GODICI

Attesting Officer    Acting Director of the United States Patent and Trademark Office